(12) United States Patent
Zanetta (10) Patent No.: US 10,050,526 B2
(45) Date of Patent: Aug. 14, 2018

(54) SWITCHING POWER CONVERTER

(71) Applicant: FREESCALE SEMICONDUCTOR, INC., Austin, TX (US)

(72) Inventor: Pedro Barbosa Zanetta, Campinas (BR)

(73) Assignee: NXP USA, Inc., Austin, TX (US)

( * ) Notice: Subject to any disclaimer, the term of this patent is extended or adjusted under 35 U.S.C. 154(b) by 164 days.

(21) Appl. No.: 15/231,981

(22) Filed: Aug. 9, 2016

(65) Prior Publication Data

US 2018/0048320 A1    Feb. 15, 2018

(51) Int. Cl.

| | |
|---|---|
| *H02M 3/156* | (2006.01) |
| *H02M 1/00* | (2006.01) |
| *H03L 7/00* | (2006.01) |
| *G05F 3/20* | (2006.01) |
| *G11C 5/14* | (2006.01) |
| *G11C 27/02* | (2006.01) |

(Continued)

(52) U.S. Cl.
CPC ............ *H02M 3/156* (2013.01); *G05F 3/205* (2013.01); *G11C 5/147* (2013.01); *G11C 27/024* (2013.01); *H02M 3/33507* (2013.01); *H03L 7/00* (2013.01); *H02M 2001/0032* (2013.01); *H02M 2001/0035* (2013.01); *H02M 2001/0041* (2013.01); *H02M 2003/1566* (2013.01); *H03K 19/0944* (2013.01); *Y02B 70/16* (2013.01)

(58) Field of Classification Search
CPC ......... H02M 3/156; H02M 2001/0032; H02M 2003/1566; H02M 1/36; H02M 2001/0041; H02M 3/157; Y02B 70/16
See application file for complete search history.

(56) References Cited

U.S. PATENT DOCUMENTS

| | | |
|---|---|---|
| 4,982,169 A | 1/1991 | Wyman |
| 6,100,751 A | 8/2000 | De et al. |
| 6,242,974 B1 | 6/2001 | Kunst |

(Continued)

FOREIGN PATENT DOCUMENTS

| | | |
|---|---|---|
| EP | 2 963 793 A1 | 1/2016 |
| EP | 3 001 554 A1 | 3/2016 |

OTHER PUBLICATIONS

Notice of Allowance U.S. Appl. No. 15/231,916 dated May 4, 2017/2016.

(Continued)

*Primary Examiner* — Ryan Johnson (57) ABSTRACT

Aspects of various embodiments of the present disclosure are directed to applications utilizing voltage regulation. In certain embodiments, an oscillator circuit is configured to generate an oscillating signal having a frequency specified by a frequency control signal. A switching power converter is configured to regulate a voltage at an output node according to a target value. The switching power converter enables a path that provides a current to the output node for cycles of the oscillating signal in which the output voltage is below (or above) a first threshold voltage. The switching power converter prevents the path from being enabled for cycles of the oscillating signal in which the output voltage is above (or below) a second threshold voltage. A control circuit adjusts the frequency control signal based on the number of cycles of the oscillating signal in which the path is presented from being enabled.

20 Claims, 9 Drawing Sheets

(51) Int. Cl.
*H02M 3/335* (2006.01)
*H03K 19/0944* (2006.01)

(56) References Cited

U.S. PATENT DOCUMENTS

| | | | |
|---|---|---|---|
| 6,341,087 B1 | 1/2002 | Kunikiyo | |
| 6,366,070 B1 * | 4/2002 | Cooke | H02M 3/1588 323/222 |
| 6,734,918 B2 | 5/2004 | Inoue | |
| 7,102,452 B1 | 9/2006 | Holmes | |
| 7,113,116 B2 | 9/2006 | Brewer et al. | |
| 7,157,956 B2 | 1/2007 | Wei | |
| 7,427,880 B2 | 9/2008 | Takahashi et al. | |
| 7,673,151 B2 | 3/2010 | Rottschafer et al. | |
| 7,733,191 B2 | 6/2010 | Olmos et al. | |
| 8,065,531 B2 | 11/2011 | Tobergte | |
| 8,248,046 B2 * | 8/2012 | Hasegawa | H02M 3/158 323/271 |
| 8,265,265 B2 | 9/2012 | Van Rijnswou | |
| 8,289,069 B2 | 10/2012 | Cheng | |
| 8,487,795 B1 | 7/2013 | Jiang et al. | |
| 9,312,765 B2 * | 4/2016 | Walsh | H02M 1/44 |
| 9,401,703 B1 | 7/2016 | Wang et al. | |
| 2005/0099167 A1 | 5/2005 | Karube | |
| 2006/0132218 A1 | 6/2006 | Tschanz et al. | |
| 2007/0279141 A1 | 12/2007 | Chui | |
| 2010/0283533 A1 | 11/2010 | Li | |
| 2011/0051927 A1 | 3/2011 | Murray et al. | |
| 2012/0250378 A1 | 10/2012 | Kok et al. | |
| 2013/0063166 A1 | 3/2013 | Ng et al. | |
| 2013/0113546 A1 | 5/2013 | Shay et al. | |
| 2013/0329470 A1 | 12/2013 | Stroppa et al. | |
| 2017/0012529 A1 * | 1/2017 | Yamada | H02M 3/158 |

OTHER PUBLICATIONS

Notice of Allowance U.S. Appl. No. 15/231,946 dated Jun. 26, 2017.
Non Final Office Action for application U.S. Appl. No. 15/231,916 dated Oct. 12, 2016.
Notice of Allowance for U.S. Appl. No. 15/231,946 dated Jan. 20, 2017.
Chen, Lidong. "SP 800-108. Recommendation for Key Derivation Using Pseudorandom Functions (Revised)." (2009).
Pique, G.V.; Meijer, M., "A 350nA voltage regulator for 90nm CMOS digital circuits with Reverse-Body-Bias," in ESSCIRC, 2011.
Li, Ting, Yuxin Wang, and Ruzhang Li. "A feedback based charge pump." Anti-Counterfeiting, Security and Identification (ASID), 2011 IEEE International Conference on. IEEE, 2011.
Pelgrom, Marcel; "Analog-to-Digital Conversion 2nd edition"; In "Analog-to-Digital on version, 2nd edition"; Springer; pp. 210-211 (Jan. 1, 2013).

* cited by examiner

SWITCHING POWER CONVERTER

OVERVIEW

Aspects of various embodiments relate generally to voltage regulation circuit and, more particularly, to switching power converters.

Switching power converters are used in a variety of applications to regulate a voltage provided to a load connected to an output node. Switching power converters generally include an actuator circuit having at least one switch configured to selectably connect a power source to an output node and a circuit to control this switch to maintain the output voltage within a target range. In one type of switching power converter, at least one switch is switched according to a constant frequency clock signal. For example, for each cycle of a clock signal (or pulsed signal), the switch closes for a short time period to provide a current to the output node. The duration of the time period that the switch is closed in response to each cycle may be adjusted by the control circuit to maintain the voltage of the output node within a target range. However, under light load conditions, switching of the switch may account for a majority of power consumption by the switching power converter.

Some switching power converters, referred to as a pulse-skipping switching power converter, reduce switching losses by skipping one or more cycles (or pulses) of a clock when operated under light load conditions. For example, a control circuit may temporarily close a switch to provide current from the power source to the output node in response to clock cycle while voltage of an output node is below a threshold voltage. If a clock cycle occurs while voltage of the output node exceeds the threshold voltage, the control circuit may prevent the switch from closing (i.e., by preventing the clock from being provided to the switch). In this manner the clock cycle is skipped. By skipping clock cycles, unnecessary switching is avoided and power consumption is reduced. However, the reduction in power consumption is limited as skipping of clock cycles does not reduce switching frequency of other circuits in the power converter, such as sampling/feedback circuitry, switching control circuitry, reference voltage generation circuitry, and/or clock generation circuitry, which operate at a constant frequency.

These and other matters have presented challenges to efficiencies of power converters, for a variety of applications.

SUMMARY

Various example embodiments are directed to circuits and methods for regulating voltages. According to an example embodiment, an apparatus includes an oscillator circuit configured to generate an oscillating signal having a frequency specified by a frequency control signal. The apparatus includes a switching power converter configured to regulate a voltage at an output node according to a target value. The switching power converter enables a path providing a current to the output node for cycles of the oscillating signal (e.g., a clock) in which the output voltage is below (or above) a first threshold voltage. The switching power converter prevents the current path from being enabled for cycles of the oscillating signal in which the output voltage is above (or below) a second threshold voltage. A control circuit adjusts the frequency control signal based on cycles of the oscillating signal in which the switching power converter prevents the current path from being enabled.

According to another example embodiment, a method is provided for regulating voltage at an output node. An oscillating signal is generated having a frequency specified by a frequency control signal. Using a switching power converter, a voltage at an output node is regulated according to a target value. The regulating of the voltage includes enabling a path providing a current to the output node for a period of time in response to the voltage at the output node being below (or above) a first threshold voltage. The regulating of the voltage also includes preventing the current path from being enabled in response to the voltage at the output node being above (or below) a second threshold voltage. The frequency control signal is adjusted based on cycles of the oscillating signal in which the switching power converter prevents the current path from being enabled.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

DETAILED DESCRIPTION

Aspects of the present disclosure are believed to be applicable to a variety of different types of apparatuses, systems and methods involving generation and/or use of regulated voltages. In certain implementations, aspects of the present disclosure have been shown to be beneficial when used in the context of applications that generated regulated voltages using switching power converters. While not necessarily so limited, various aspects may be appreciated through a discussion of examples using such exemplary contexts.

According to an example embodiment, an apparatus includes an oscillator circuit configured to generate an oscillating signal having a frequency specified by a frequency control signal. The apparatus includes a switching power converter configured to regulate a voltage at an output node according to a target value. For instance, the switching power converter may enable a path to provide a current to the output node for cycles of the oscillating signal in which the output voltage is below (or above) a first threshold voltage. The switching power converter skips cycles, for example, in response to the output voltage exceeding (or falling below) a second threshold voltage. The second threshold voltage may be the same as first threshold voltage or may be a different threshold voltage. In skipping a cycle, the switching power converter prevents the switch from enabling the current path.

As previously noted, skipping of cycles may reduce power consumption of an actuator circuit (e.g., a charge pump) in a power converter but does not reduce switching frequency of other circuits in the power converter, such as sampling/feedback circuitry, switching control circuitry, reference voltage generation circuitry, and/or clock generation circuitry, which are switched each cycle of the oscillating signal. Some various embodiments reduce power consumption by such other circuits adjusting the frequency of the oscillating signal based on cycles of the oscillating signal that are skipped by the actuator.

An adaptive frequency control circuit adjusts the frequency of the oscillating signal, via the frequency control signal, based on cycles of the oscillating signal that are skipped by the switching power converter. For example, in some embodiments, the frequency control circuit may decrease the frequency in response to the number of cycles skipped by the switching power converter exceeding a threshold number. By reducing the frequency, power consumption of circuits driven by the oscillating signal is reduced. Conversely, the frequency may be based on the number of cycles that are not skipped by the switching power converter. The number of cycles skipped/non-skipped may be derived differently in various implementations. For example, the adjustment may be based on the number of consecutive cycles skipped or an average number of skipped cycles in a particular number of cycles (e.g., using moving averaging or other filters). For ease of explanation, the examples are primarily described with reference to adjustment based on the number of consecutive cycles skipped and/or not-skipped.

The switching frequency of a switching power converter may be adjusted to match the requirements of the current operation conditions (e.g., load current and power supply levels) and thereby reduce switching losses. For instance, the frequency control circuit may infer the load condition based on the skipped cycles and adapt the clock frequency to a value close to the minimum required to maintain a regulated voltage within a target range. With this approach, the power consumption is reduced, which may be particularly critical under light load conditions.

In some embodiments, the frequency control circuit may be configured to initially set the frequency to the highest frequency supported by a circuit generating the clock and/or switching power supply. By operating the switching power supply at the highest frequency, the startup time required for the switching power supply to provide a stable regulated voltage to a load is reduced. The frequency control circuit may then gradually reduce the frequency in response to cycle skips until an optimal frequency range is reached in which few cycle skips are required. In some implementations, the frequency control circuit may be configured to reset the frequency to the highest frequency in response to a flag signal from an asynchronous voltage monitor. For example, the control signal may be set, in response to detecting a sudden change in the output voltage (e.g., due to increased load), to facilitate fast recovery of the stable regulated voltage. Example processes and circuits for adjusting the frequency are described in more detail with reference to the figures.

For ease of reference, the examples are primarily described with reference to adjustment of the frequency based on the number of skipped cycles. However, the embodiments are not so limited. For example, in some embodiments, the frequency control circuit may adjust frequency by applying a digital filter to the skip control signal. In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Figure 1:
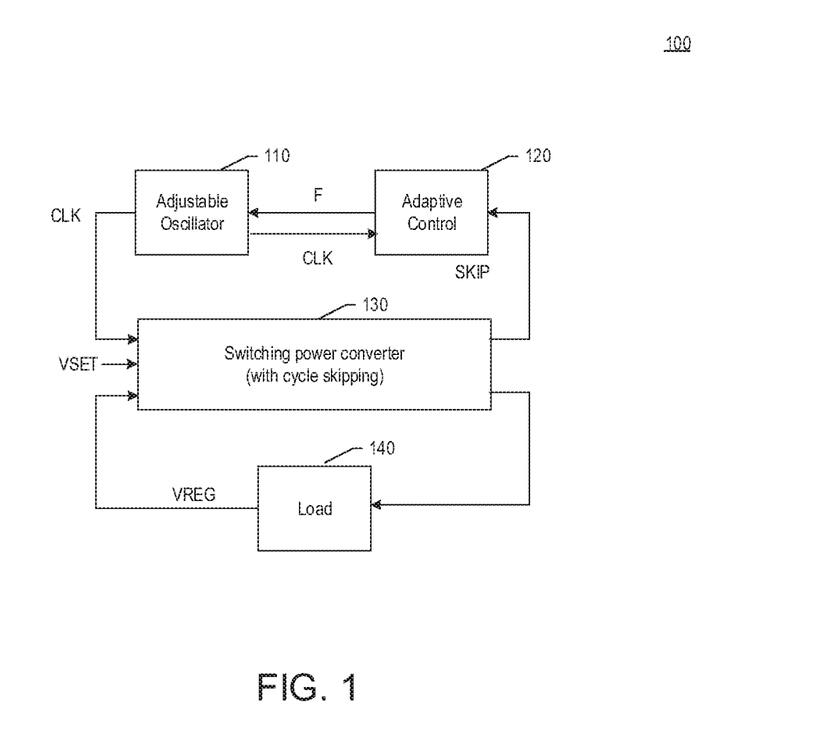
FIG. 1 shows a block diagram of an example circuit for generating a regulated voltage, in accordance with one or more embodiments of the present disclosure.

Turning now to the figures, FIG. 1 shows a block diagram of an example circuit for generating a regulated voltage, in accordance with one or more embodiments of the present disclosure. The circuit 100 includes a frequency adjustable oscillator circuit 110 configured to generate an oscillating signal (CLK) having a frequency specified by a frequency control signal (F). A switching power converter 130 is configured to regulate a voltage (VREG) generated at an output node according to the target value VSET.

The switching power converter 130 is configured to skip cycles of the CLK signal based on one or more load characteristics such as voltage at a regulated node, load current, and/or load impedance. The switching power converter 130 may skip cycles based on a feedback signal (VFBK) indicating a measurement of one or more various load characteristics (e.g., load current or output node voltage). For instance, the cycle may be skipped in response to the output voltage exceeding a threshold voltage.

In this example, the switching power converter 130 is configured to provide a signal (SKIP) indicating whether or not cycles of the CLK signal are skipped. Adaptive frequency control circuit 120 is configured to adjust frequency of the CLK signal, via the F control signal, based on the cycles skipped by the switching power converter 130. For example, the adaptive frequency control circuit 120 may reduce the frequency of the CLK signal in response to the number of consecutive skipped cycles exceeding a first threshold number. Conversely, the adaptive frequency control circuit 120 may increase the frequency in response to number of consecutive the cycles that are not skipped exceeding a second threshold number.

Figure 2:
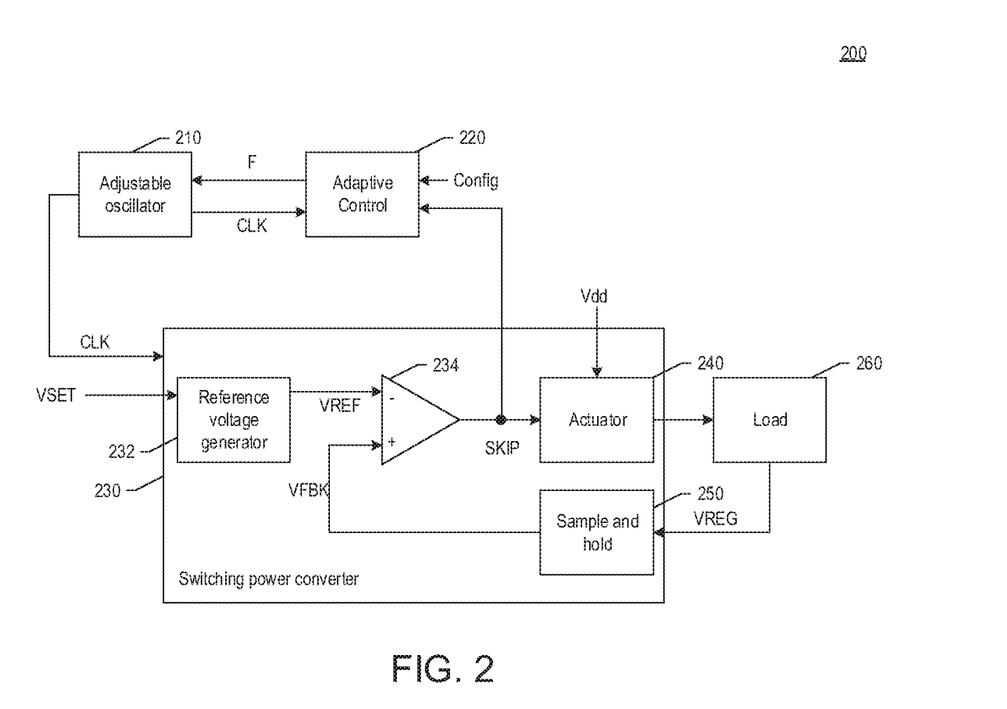
FIG. 2 shows a block diagram of another example circuit for generating a regulated voltage, in accordance with one or more embodiments of the present disclosure.

FIG. 2 shows a block diagram of an example circuit for generating a regulated voltage, in accordance with one or more embodiments of the present disclosure. The circuit 200 includes a frequency adjustable oscillator 210 configured to generate an oscillating signal CLK having a frequency specified by a frequency control signal (F). A switching power converter 230 is configured to maintain a voltage VREG at an output node (e.g., connected to load 260). The switching power converter 230 generates the VREG voltage according to the signal VSET with reference to switching power converter 130 in FIG. 1.

The switching power converter 230 may be implemented using various circuit arrangements. In this example, the switching power converter 230 includes an actuator circuit configured to regulate a voltage of the output node in each cycle of the CLK signal according to the SKIP signal. The actuator circuit 240 may be implemented using various types of isolating or non-isolating regulator circuits including, but not limited to charge pumps.

A monitor circuit 234 is configured to generate a control signal (SKIP) to cause the actuator to skip select cycles of the CLK signal. In this example, the comparator 234 configured to set the SKIP control signal to logic 1 or logic 0 based on a comparison of VFBK to a reference voltage VREF generated by reference voltage generator 232.

The circuit 200 also includes an adaptive frequency control circuit 220, which is configured to adjust frequency of the CLK signal based on the cycles skipped by the actuator 240 as described with reference to adaptive frequency control circuit 120 in FIG. 1.

Figure 3:
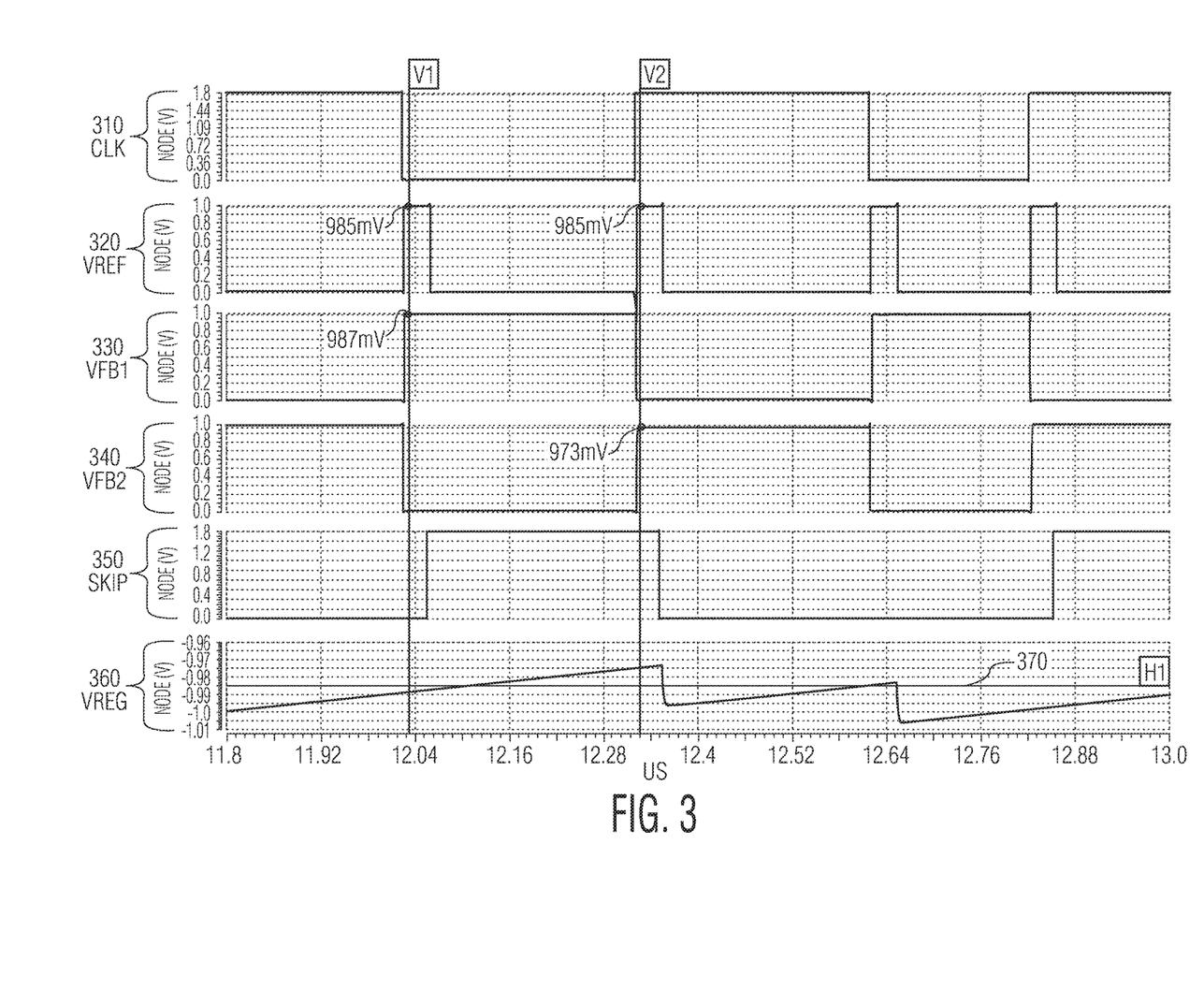
FIG. 3 is a graph showing voltages generated at various nodes of an example switching power converter circuit during operation, in accordance with one or more embodiments of the present disclosure.

FIG. 3 is a graph showing voltages generated at various nodes of an example switching power converter circuit during operation, in accordance with one or more embodiments of the present disclosure. In this example, the switching power converter is configured to generate a negative voltage 360, for example, for reverse body-biasing transistors. After some delay from each clock edge, the switching power converter decreases the output voltage 360 unless the SKIP signal indicates the cycle is to be skipped. On the falling edge of the CLK signal, the SKIP control signal is generated based on a comparison between VREF and VFBK1. On the rising edge of the CLK signal, the SKIP control signal is generated based on a comparison between VREF and VFBK2. In this example, the switching power converter is configured to skip cycles when the output voltage 360 is above a threshold voltage 370. The SKIP signal 350 is set to a logic 1 to force the actuator to skip the current clock cycle and is otherwise set to logic 0. Based on the number of consecutive clock cycles skipped and/or not skipped, the frequency of the clock signal may be adjusted as discussed with reference to FIGS. 1 and 2.

Figure 4:
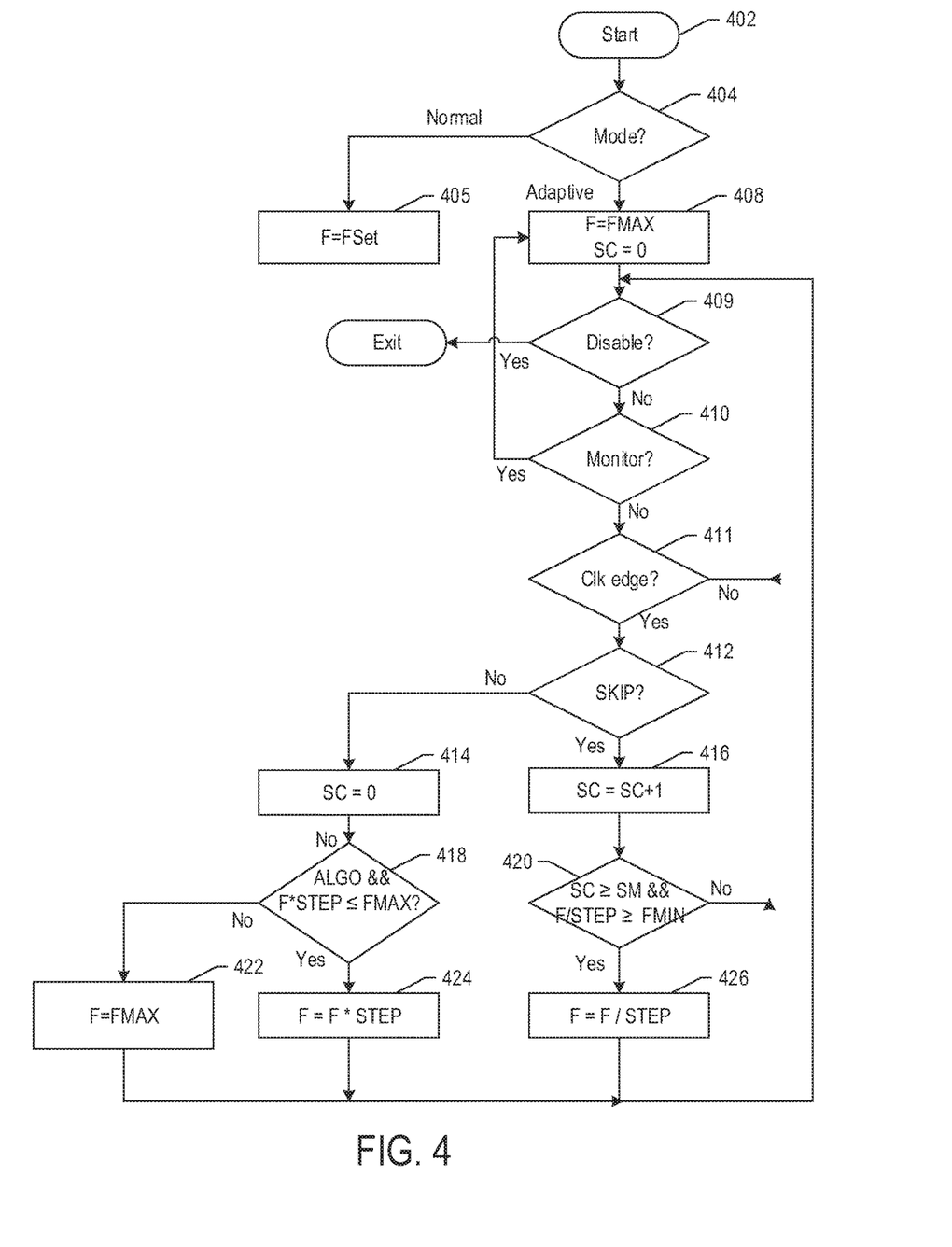
FIG. 4 shows a flow chart of an exemplary process for controlling frequency of a clock signal used by a switching power converter.

FIG. 4 shows a flow chart of an exemplary process for controlling frequency of a clock signal used by a switching power converter, in accordance with one or more embodiments of the present disclosure. At the start 402 of the process, the process proceeds to decision block 404. If adaptive frequency adjustment is disabled, at decision block 404, the frequency (F) of the clock signal CLK is set to a constant frequency FSET. If adaptive frequency adjustment is enabled, at decision block 404, the process proceeds to block 408. At block 408, a skip count value (SC) is set to zero and a frequency F of the clock signal CLK is initially set to a maximum frequency (FMAX) supported by the frequency adjustable oscillator circuit (e.g., 110) and/or switching power converter (e.g., 130).

If the switching power converter is disabled (e.g., by a control signal) at decision block 409, the process exits. Optionally, an output voltage may be monitored to ensure the output voltage stay within a particular range. If the output voltage moves outside the allowed range (e.g., as indicated by a flag signal), the clock frequency is asynchronously set back to the maximum at block 408 to provide fast reaction. If not disabled or in monitor mode, the process the waits at decision block 411 until the oscillator starts to operate. When a clock edge is encountered, the process proceeds from decision block 411 to decision block 412. If the SKIP signal is set to skip the current cycle, at decision block 412, the count value SC is incremented at block 416.

At decision block 420, is the count SC is greater than or equal to a threshold count (SM) and the next decrease step is within the operational frequency range (i.e., F/STEP≥FMIN), the frequency is decreased by the STEP amount at block 426. In this example, each decrease divides the current frequency by a STEP value. In terms of reaction time, power consumption and circuit area, it is convenient to increase or decrease the clock frequency exponentially by multiplying/dividing the current frequency by the step value. In some implementations, frequency may be adjusted linearly by adding/subtracting a step value to/from the current frequency. If the count SC is less than the threshold count SM or if the next decrease step is outside of the operational frequency range, or following block 426, the process returns to decision block 409.

If the SKIP signal is not set to skip the current cycle, at decision block 412, the count SC is reset to 0 at block 414. If a fast recovery signal is set (i.e., ALGO set to logic 0) at decision block 418, or if the next increase step is not within the operational frequency range (i.e., F*STEP>FMAX), the frequency F is reset to the maximum frequency FMAX at block 422. The faster clock frequency allows a switching power converter to adapt more quickly to changes in the load conditions. If a fast recovery signal ALGO is set to logic level 1, at decision block 418 and the next increase step is within the operational frequency range (i.e., F*STEP≤FMAX), the frequency is increased by the STEP amount at block 424. In this example, each increase step multiplies the current frequency by the STEP value. Following blocks 422 or 424, if the next increase frequency step value is within the operational frequency range, the process returns to decision block 409.

The disclosed circuits and methods for adaptive frequency control may be useful for a variety of applications using switching power converters. As one illustrative example, adaptive frequency control may be used to improve efficiency of switching power converters used to generate voltages for biasing the bodies of transistors of an electronic circuit. Transistor body biasing is used in many applications to adjust threshold voltage of a transistor (and correspondingly to the leakage current, power, and switching speed). The threshold level is adjusted by setting the body of a transistor at a voltage different than the voltage applied to the source of the transistor. Reverse body biasing can be used to raise the threshold voltage of a transistor. With an N-type Field Effect Transistor (NFET), reverse body biasing sets the body voltage to be less than the voltage applied to the source (e.g., VSS). For a P-type FET (PFET), reverse body biasing sets the body voltage to be greater than the voltage applied to the source (e.g., VDD). Forward body biasing can be used to lower the threshold voltage of a transistor. For an NFET, forward body biasing sets the body voltage to be greater than the voltage applied to the source. For a PFET, forward body biasing sets the body voltage to be less than the voltage applied to the source. In some embodiments, a first switching power converter (e.g., as described with reference to FIGS. 1 and/or 2) may be used to generate a voltage for body biasing PFETs and a second switching power converter may be used to generate a voltage for body biasing NFETs. An adaptive frequency control circuit may be configured to adjust a clock signal used to control switching of the two switching power converters based on cycles skipped by one and/or both of the switching power converters.

Figure 5:
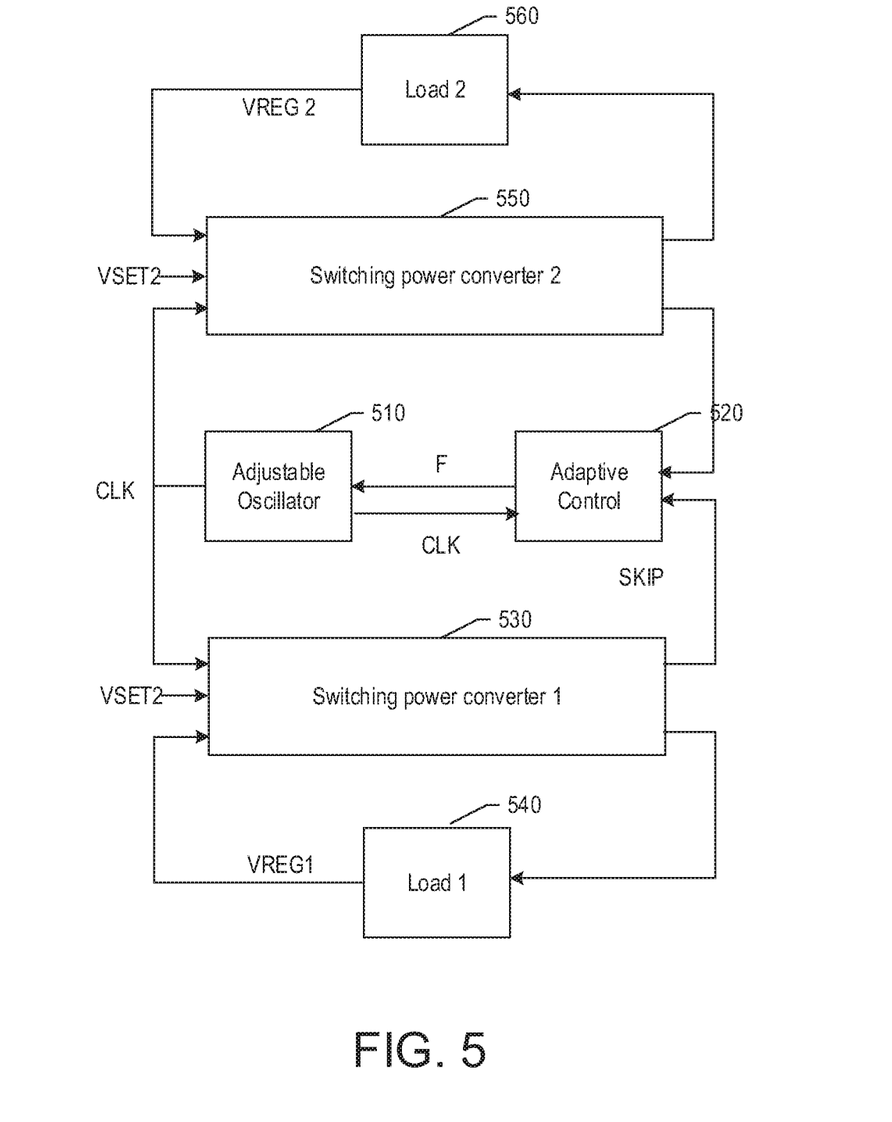
FIG. 5 shows a block diagram of an example circuit for generating multiple regulated voltages, in accordance with one or more embodiments of the present disclosure.

In some embodiments, adaptive frequency control may be used to adjust a clock frequency used for generation of multiple regulated voltages. FIG. 5 shows a block diagram of an example circuit for generating multiple regulated voltages, in accordance with one or more embodiments of the present disclosure. The circuit includes a frequency adjustable oscillator 510, an adaptive control circuit 520, and a switching power converter 530 configured to regulate a first voltage (VREG1) for a first load circuit 540 as described with reference to frequency adjustable oscillator 110, an adaptive control circuit 120, a switching power converter 130, and load circuit 140 in FIG. 1. In this example, the CLK signal generated by the frequency adjustable oscillator 510 is also used to regulate switching of a second switching power converter 550 configured to regulate a second voltage (VREG2) for a second load circuit 560. The adaptive control circuit 520 may adjust the frequency of the CLK signal generated by the frequency adjustable oscillator 510 based on clock cycles skipped by the first switching power converter 530 and/or the second switching power converter 550.

Figure 6:
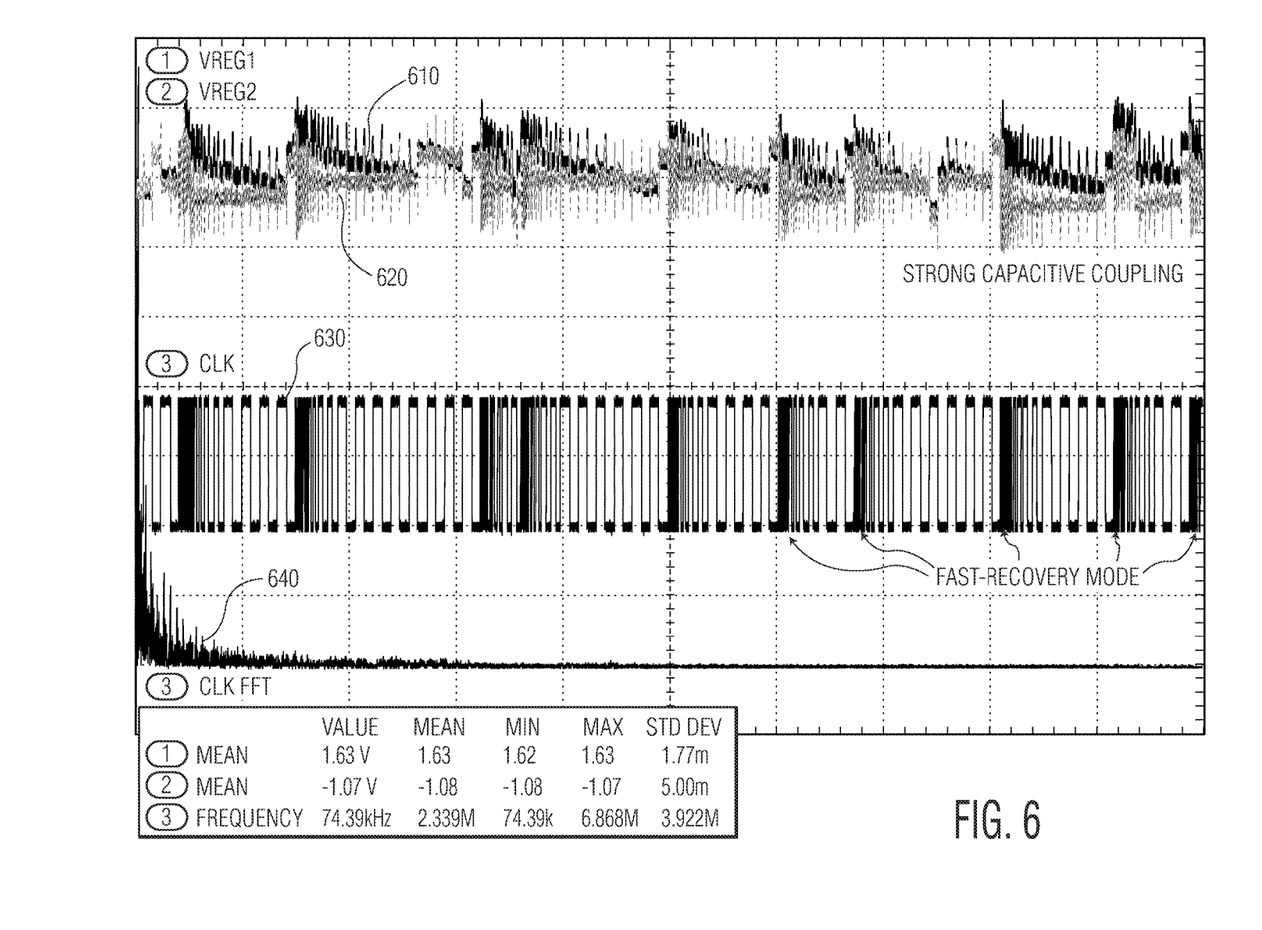
FIG. 6 is a graph showing two output voltages generated from regulated charge pumps using a common clock signal of an example switching power converter circuit, in accordance with one or more embodiments of the present disclosure.

FIG. 6 is a graph showing the regulated voltages on two nodes with strong capacitive coupling during operation of the switching power converter circuit shown in FIG. 5, in accordance with one or more embodiments of the present disclosure. In this example, the switching power converter is configured to regulate voltages VREG1 and VREG2. The voltages VREG1 and VREG2 may be used, for example, respectively bias wells of PMOS and NMOS transistors. Waveform 630 shows a clock signal CLK. The frequency of the CLK signal is dynamically adjusted during operation to adapt to changes in the operating conditions (e.g., power supply levels, load current, temperature, etc). The clock may be set to a high frequency, in a fast recovery mode (e.g., when voltage goes below a target voltage) to improve transient response. As described with reference to the process shown in FIG. 4, after setting the clock signal to the high frequency, frequency is gradually reduced in response to cycle skips. Waveform 640 shows a frequency distribution of the clock signal CLK shown in waveform 630. As shown in 640, the majority of the clock signal CLK is located in the lower frequency range, thereby reducing power consumption.

Figure 7:
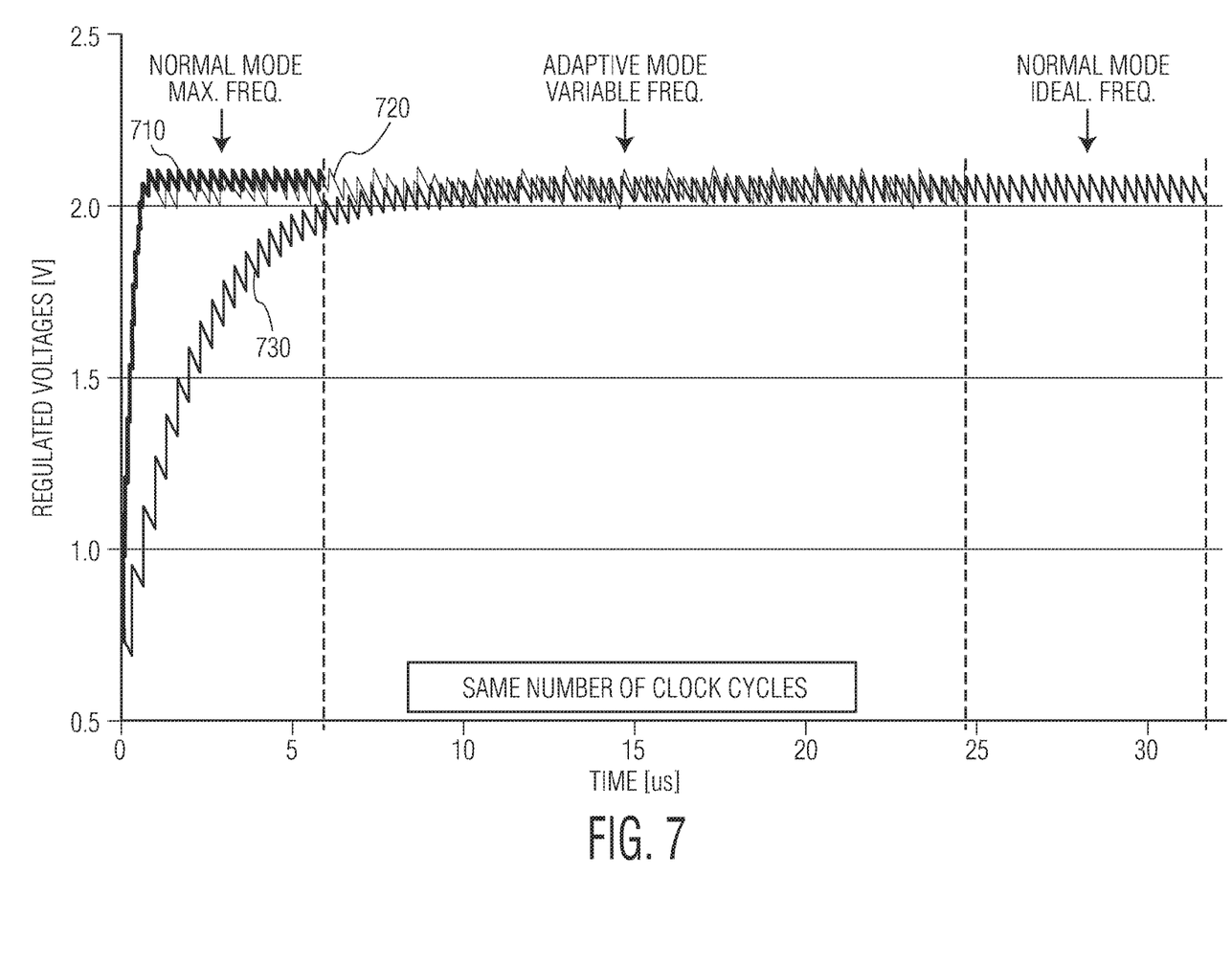
FIG. 7 is a graph illustrating performance of some example switching power converter circuits, in accordance with one or more embodiments of the present disclosure.

The adaptive adjustment of frequency also improves startup and/or recovery time required to place a regulated node at a target voltage. FIG. 7 is a graph showing performance of some example switching power converter circuits during startup, in accordance with one or more embodiments of the present disclosure. Waveform 730 shows a first voltage regulated by a switching power converter operated at a fixed ideal frequency for a specific load condition, which is the minimum necessary frequency (i.e., no cycle is skipped on the converter). In this example, it takes approximately 9 μs for a switching power converter operating at the fixed ideal frequency to reach a target voltage of 2V. Waveform 710 shows another voltage regulated by the switching power converter operated at a maximum supported frequency. When operated at the maximum frequency, the regulated voltage quickly reaches the target voltage within approximately 1 μs. Waveform 720 shows another voltage regulated by the switching power converter operated with adaptive frequency adjustment. As described with reference to the process shown in FIG. 4, the switching power converter is initially operated at the maximum supported frequency. Accordingly, similar to waveform 710, the regulated voltage quickly reaches the target voltage within approximately 1 μs. However, as previously discussed, the adaptive adjustment of the frequency allows the clock frequency to be reduced during operation, thereby reducing power consumption, while maintaining the regulated voltage. Waveforms 720 and 730 provide almost the same ripple and average voltages. The dynamic current consumption within adaptive mode approaches the ideal case where the frequency is set to the minimum required value at that specific condition. As time passes, the dynamic consumption of these circuits (i.e., 720 and 730) approach to each other (e.g., similar number of clock cycles).

Sampling of body bias voltages (e.g., NW and PW) can be challenging since the bias voltages may be outside of supply voltage rails (e.g., Vdd and Vss) used to power the sampling circuits. For example, high voltages may damage sampling circuitry by causing large voltage drops (e.g., exceeding Vdd–Vss) across transistors. Certain aspects of the present disclosure relate to sampling circuits for sampling voltages outside of supply voltage rails while avoiding large voltage drops across circuit components. Large voltage drops are avoided, for example, by sampling a voltage difference between an input node and the closest supply voltage rail, and then shifting the voltage difference to provide a voltage the supply voltages rails that is indicative of the input node voltage. As the output node voltage is within the supply voltage rails, the voltage may be processed (e.g., quantized by an analog-to-digital-converter (ADC)) using circuits operating within the supply voltage rails.

As one example, a positive voltage (Vdd$^+$) exceeding Vdd may be sampled with reference to Vdd in a first mode using a capacitor having a first terminal connected to Vdd$^+$ and a second terminal connected to Vdd. In a second mode, the voltage difference ($V_{dif}$=Vdd$^+$−Vdd) is shifted by connecting the second terminal of the capacitor to Vss and the first terminal to an output node. As a result, the output is set to a voltage (Vss+$V_{dif}$) within the voltage rails.

As another example, a negative voltage (Vss$^-$) below Vss may be sampled with reference to Vss in a first mode using a capacitor having a first terminal connected to Vss- and a second terminal connected to Vss. In a second mode, the voltage difference ($V_{dif}$=Vss−Vss$^-$) stored by the capacitor is shifted by connecting the first terminal of the capacitor to Vss and the second terminal to an output node. The output is thereby set to a voltage (Vss+$V_{dif}$) within the voltage rails.

In an example embodiment, a sampling circuit includes first and second capacitors and a switching circuit. The switching circuit is configured to selectively connect the capacitors for interleaved sampling of an input node in first and second modes. In the first mode, the switching circuit connects the first capacitor between the input node and the closest supply voltage (e.g., Vss for sampling negative voltages). In the first mode, the switching circuit also connects the second capacitor between the output node and a lower supply voltage (e.g., Vss) to hold the output node at a voltage equal to an inversion of a sampled voltage difference referenced against the closest supply voltage. In the second mode, the switching circuit connects the first capacitor between the output node and the lower supply voltage to hold the output node at the voltage difference sampled in the first mode and referenced against the supply voltage (e.g., Vss). In the second mode, the switching circuit also connects the second capacitor between the input node and the closest supply voltage for sampling a new voltage difference.

Figure 8:
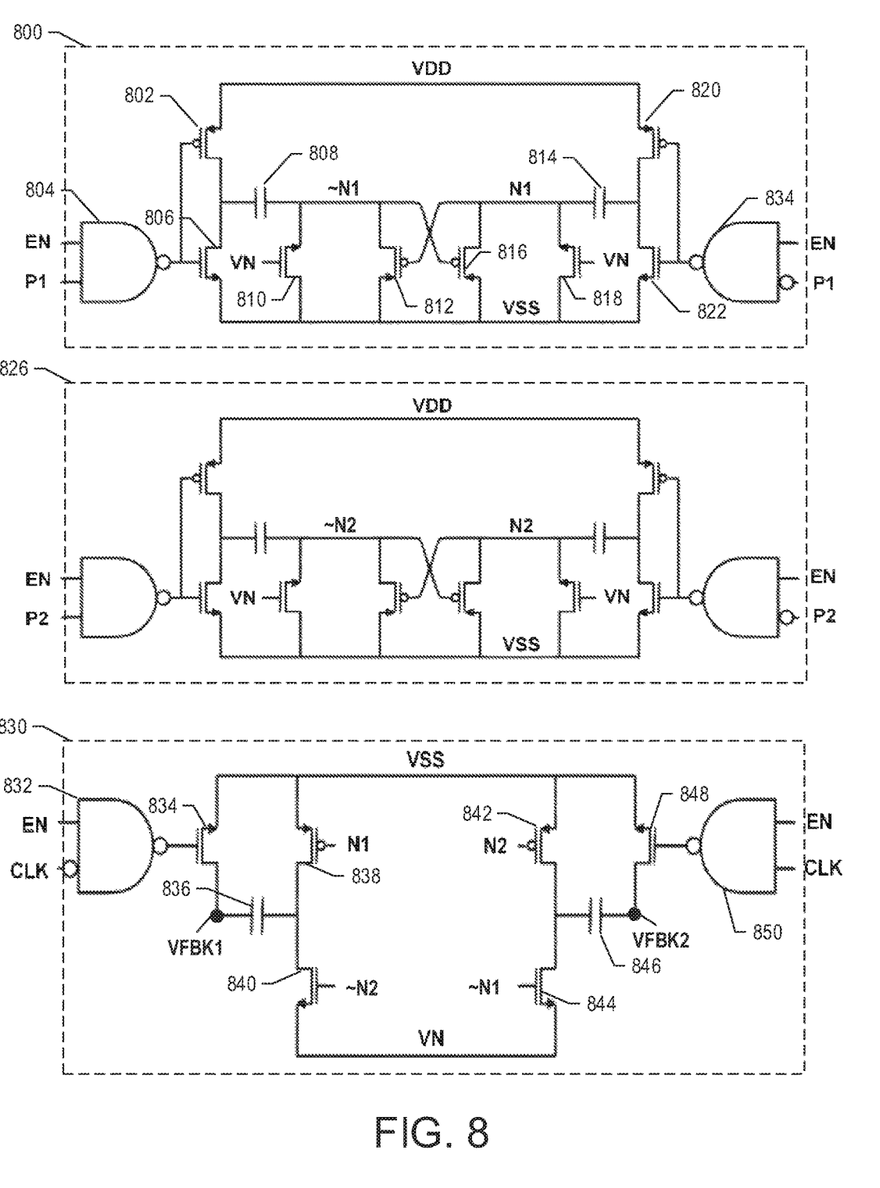
FIG. 8 shows a schematic of an example sampling circuit, in accordance with one or more embodiments of the present disclosure.

Turning again to the figures, FIG. 8 shows a schematic of an example circuit for sampling a voltage, in accordance with one or more embodiments of the present disclosure. The circuit includes a sampling circuit 830 having first and second capacitors 836 and 846 and a switching circuit a switching circuit formed by transistors 834, 838, 840, 842, 844, and 848 and NAND gates 832 and 850.

In the first mode, the switching circuit is configured to connect the first capacitor 836 for sampling a voltage difference between of the input node and the closest supply voltage rail and connect the second capacitor 846 for holding the output node at a voltage previously sampled by the second capacitor 846. In this mode, transistors 840 and 834 are turned on and transistor 838 is turned off to sample the voltage difference using capacitor 836. Also in the first mode, transistor 842 is turned on and transistors 844 and 848 are turned off to provide the shifting of a voltage difference previously sampled by capacitor 846 to output node VFBK2.

In a second mode, the switching circuit is configured to connect the second capacitor 846 for sampling the voltage different between of an input node and the closest supply voltage rail and connect the first capacitor 836 for holding the output node at a shift of the voltage different previously sampled by the first capacitor 836. In this mode, transistors 840 and 834 are turned off and transistor 838 is turned on to provide the inversion of a voltage difference previously sampled by capacitor 836 to output node VFBK1. Also in the first mode, transistor 842 is turned off and transistors 844 and 848 are turned on to sample the next voltage difference using capacitor 846.

The sampling circuit 830 provides a sampled voltage to a respective output VFBK1 or VFBK2 in each of the two modes. In some implementations, the outputs VFBK1 or VFBK2 may be connected to provide the sampled voltages to a shared output node in both of the first and second modes. For example, a multiplexor circuit controlled by a control signal may be used to connect VFBK2 to the shared output node in the first mode and connect VFBK1 to the shared output node in the second mode. The sampling circuit 830 is configured to sample voltages below the supply voltage rails. In some embodiments, the sampling circuit 830 may be adapted for sampling voltages above the supply voltage rails.

The switching of the switching circuit is controlled by CLK and a set of control signals N1, N2, ~N1, ~N2, which are derived from non-overlapping clock signals (e.g., P1 and P2). The non-overlapping nature of the control signals causes the switches to be operated in a break-before-make manner, where all transistors are turned off before any transistors are turned on.

In this example, the N1, N2, ~N1, ~N2 control signals are generated by level-shifting the non-overlapping clock signals outside of the supply voltage rails to a range in which the N1, N2, ~N1, ~N2 will correctly switch the transistors on/off in the first and second modes as previously described.

In this example, N1 and ~N1 are derived from non-overlapping clock signals P1 and P2 by voltage shifting circuit 800. N2 and ~N2 are similarly derived from the non-overlapping clock signals by voltage shifting circuit 826, which has the same arrangement as circuit 800.

In this example, the voltage shifting circuit 800 is formed by an arrangement of two NAND gates 804 and 834, two capacitors 808 and 814, and transistors, 802, 806, 810, 812, 816, 818, 820, and 822. When enabled, the NAND gate 804 provides the clock signal P1 to an input of an inverter formed by transistors 802 and 806. NAND gate 834 provides an inversion of the clock signal P1 to an input of an inverter formed by transistors 820 and 822. Capacitor 814 is connected between an output of the inverter 820/822 and output node N1. Capacitor 808 is connected between an output of the inverter 802/806 and output node ~N1. Output node N1 is connected to Vss by transistor 818, which is driven by control signal VN, and by transistor 816 which is driven by output node ~N1. Output node ~N1 is connected to Vss by transistor 810, which is driven by control signal VN, and by transistor 812 which is driven by output node N1.

When P1 is set high, capacitor 808 is connected between Vdd and Vss, and output node ~N1 is set to Vss. When P1 is set low, the inverter 802/806 connects the capacitor to Vss thereby shifting the voltage of output node ~N1 below Vss. Conversely, when P1 is set low, capacitor 814 is connected between Vdd and Vss, and output node N1 is set to Vss. When P1 is set low, the inverter 820/822 connects the capacitor to Vss thereby shifting the voltage of output node ~N1 below Vss. In this manner, a voltage shifted version of P1 and ~P1 are presented at output nodes N1 and ~N1.

Figure 9:
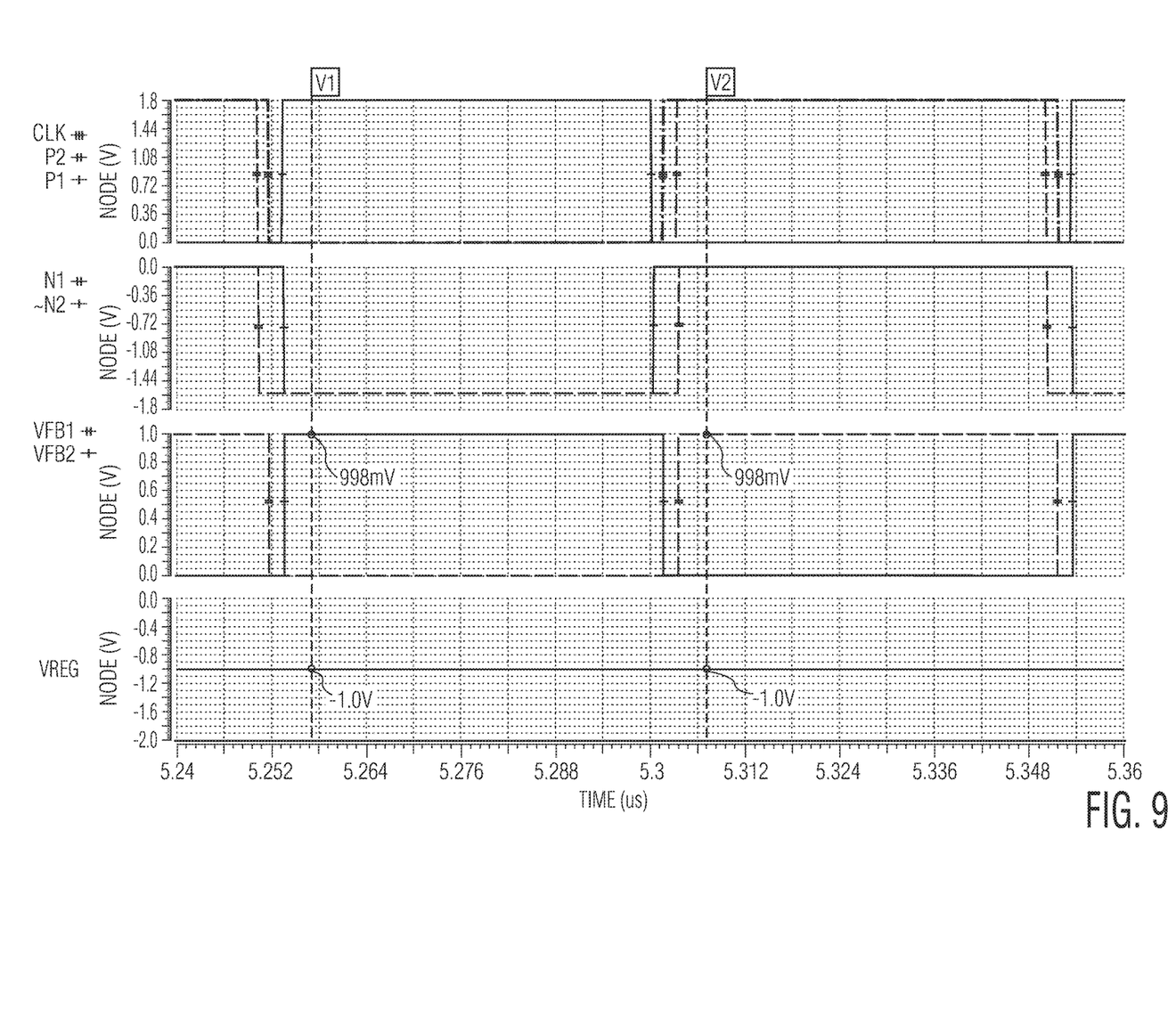
FIG. 9 shows the voltages at various nodes of an example sample and hold circuit during operation, in accordance with one or more embodiments of the present disclosure; and While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

FIG. 9 is a graph showing voltages generated at various nodes of the circuits shown in FIG. 8 during operation, in accordance with one or more embodiments of the present disclosure. Non-overlapping input signals P1 and P2 are derived from CLK. Non-overlapping control signals N1 and ~N2 and control signals are generated from the non-overlapping clock signals. As described with reference to FIG. 3, the control signals N1, N2, ~N1, and ~N2 cause a regulated voltage VREG to be sampled at the edges of the clock signal CLK to produce sample voltages VFBK1 and VFBK2.

A skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 110, 120, 130, and 132 of FIG. 1 depict a block/module as described herein). Such circuits or circuitry are used together with other elements to exemplify how certain embodiments may be carried out in the form of structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1, 2, 5 and 8. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described with reference to FIGS. 2 and 3 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus, comprising:
    an oscillator circuit configured and arranged to generate an oscillating signal having a frequency specified by a frequency control signal;
    a switching power converter circuit configured to regulate a voltage at an output node by, for respective cycles of the oscillating signal,
        enabling a path that provides a current to the output node for a period of time in response to the voltage at the output node being below or above a first threshold voltage; and
        preventing the path from being enabled in response to the voltage at the output node being above or below a second threshold voltage; and
    a control circuit configured to adjust the frequency control signal by counting a number of the cycles of the oscillating signal in which the switching power converter prevents the path from being enabled.

2. The apparatus of claim 1,
    wherein the control circuit includes a digital filter to set the frequency control signal according to a signal indicating cycles of the oscillating signal in which the path is prevented from being enabled.

3. The apparatus of claim 1,
    wherein the control circuit adjusts the frequency control signal by
        decreasing the frequency specified by the frequency control signal based on a number of consecutive cycles of the oscillating signal in which the switching power converter prevents the path from being enabled; and
        increasing the frequency specified by the frequency control signal based on the number of consecutive cycles of the oscillating signal in which the switching power converter enables the path.

4. The apparatus of claim 3,
    wherein the control circuit is configured to initially set the frequency specified by the frequency control signal to an upper frequency.

5. The apparatus of claim 4,
    wherein the control circuit is configured to set the frequency specified by the frequency control signal to the upper frequency value in response to a flag signal, which indicates when the voltage on the output node is outside a target range.

6. The apparatus of claim 3, wherein:
    the decreasing of the frequency includes dividing the frequency by a first step value; and
    the increasing of the frequency includes multiplying the frequency by a second step value.

7. The apparatus of claim 1,
    wherein the control circuit is configured to
        in a first mode perform the adjusting of the frequency control signal; and
        in a second mode, maintain the frequency control signal at a constant value.

8. The apparatus of claim 1,
    further comprising a logic circuit coupled to the switching power converter, and
    wherein the switching power converter circuit is configured and arranged to bias a body of at least one transistor of the logic circuit using the regulated voltage at the output node.

9. The apparatus of claim 8,
    further comprising a second switching power converter configured to
        regulate a second voltage at a second output node and
        bias one or more transistors of the logic circuit, having a conductivity type that is different from the at least one transistor, using the second voltage.

10. The apparatus of claim 1,
    wherein the voltage at the output node is outside of a pair of supply voltage rails used to power the switching power converter; and
    further comprising a sampling circuit configured to sample a voltage at the output node by:
        in a first mode, connecting a first terminal of a capacitor to an input of the sampling circuit and connecting a second terminal of the capacitor to one of the pair of supply voltage rails; and
        in a second mode, connecting the first terminal of the capacitor to the one of the pair of supply voltage rails and connecting the second terminal to an output of the sampling circuit.

11. The apparatus of claim 10,
    wherein the sampling circuit is further configured to,
        in the second mode, connect a first terminal of a second capacitor to an input of the sampling circuit and connect a second terminal of the second capacitor to the one of the pair of supply voltage rails; and
        in the first mode, connect the first terminal of the second capacitor to the one of the pair of supply voltage rails and connect the second terminal of the second capacitor to the output of the sampling circuit.

12. A method, comprising:
    generating an oscillating signal having a frequency specified by a frequency control signal;
    using a switching power converter, regulating a voltage at an output node by, for respective cycles of the oscillating signal, enabling a path that provides a current to the output node for a period of time in response to the voltage at the output node being crossing a first threshold voltage; and preventing the path from being enabled in response to the voltage at the output node crossing a second threshold voltage; and adjusting the frequency control signal by counting a number of cycles of the oscillating signal in which the switching power converter prevents the path from being enabled.

13. The method of claim 12, wherein the first and second threshold voltages are equal to each other.

14. The method of claim 12, wherein adjusting of the frequency control signal includes, decreasing the frequency specified by the frequency control signal based on a number of consecutive cycles of the oscillating signal in which the switching power converter prevents the path from being enabled; and increasing the frequency specified by the frequency control signal based on the number of consecutive cycles of the oscillating signal in which the switching power converter enables the path.

15. The method of claim 14, wherein the decreasing of the frequency is performed in response to the number of cycles of the oscillating signal, for which the switching power converter prevents the path from being enabled, exceeding a threshold number.

16. The method of claim 14, further comprising initially setting the frequency specified by the frequency control signal to an upper frequency.

17. The method of claim 16, further comprising setting the frequency specified by the frequency control signal to the upper frequency in response to a flag signal, which indicates when the voltage on the output node is outside of a target range.

18. The method of claim 14, wherein:

the decreasing of the frequency includes dividing the frequency by a first step value; and the increasing of the frequency includes multiplying the frequency by a second step value.

19. The method of claim 12, further comprising:

in a first mode, performing the adjusting of the frequency control signal; and in a second mode, maintaining the frequency control signal at a constant value.

20. The method of claim 12, further comprising biasing a body of at least one transistor of a logic circuit, having a first conductivity type, using the voltage at the output node;

using a second switching power converter regulating a second voltage at a second output node; and using the second voltage, biasing at least one transistor of the logic circuit having a second conductivity type.

* * * * *